United States Patent [19]

Childers et al.

[11] Patent Number: 4,975,874

[45] Date of Patent: Dec. 4, 1990

[54] MATRIX INTERCONNECTION SYSTEM WITH DIFFERENT WIDTH CONDUCTORS

[75] Inventors: Jimmie D. Childers, Missouri City; Hugh P. McAdams, Houston, both of Tex.

[73] Assignee: Texas Instruments Incorporated, Dallas, Tex.

[21] Appl. No.: 265,750

[22] Filed: Nov. 1, 1988

[51] Int. Cl.$^5$ ............................................. G11C 5/06
[52] U.S. Cl. .......................................... 365/63; 365/51
[58] Field of Search ...................... 365/51, 63, 230.03; 307/530

[56] References Cited

U.S. PATENT DOCUMENTS 4,636,982  1/1987  Takemae et al. ............... 365/230.03
4,807,191  2/1989  Flannagan ...................... 365/230.03

OTHER PUBLICATIONS

IBM Technical Disclosure Bulletin-vol. 25, No. 7A, Dec. 1982; pp. 3316–3317.

Primary Examiner—James W. Moffitt
Attorney, Agent, or Firm—Mel Sharp; James T. Comfort; N. Rhys Merrett

[57] ABSTRACT

The described embodiment of the present invention utilizes the regular nature of a large number of arrays by providing a grid scheme in the array to provide a low impedance point to point interconnection. In the described embodiment of the present invention a DRAM includes a number of leads running perpendicular to the sense amplifier layout. For a given signal, each lead is interconnected at a bus lead running parallel to the layout of the sense amplifiers. Thus each lead in the parallel array carries a portion of the current. In addition, in this scheme it can be assured that a substantial number of leads will be near any particular sense amplifier which is drawing on the signal provided on the grid array scheme. Because of the close proximity of the parallel conductors, the bus lines to the sense amplifiers need not be as wide as feeder lines in the prior art. Because the parallel grid leads and the bus leads may be much smaller than the leads in the prior art, they may be more compactly arranged in the array.

12 Claims, 1 Drawing Sheet

MATRIX INTERCONNECTION SYSTEM WITH DIFFERENT WIDTH CONDUCTORS

FIELD OF THE INVENTION

The present invention relates to the field of integrated circuit layout schemes. More specifically, the present invention relates to interconnection schemes for integrated circuitry.

BACKGROUND OF THE INVENTION

It is a well known fact in electronics that the speed with which a signal may propagate along a conductor is dependent upon the capacitance of the conductor and the connected to element along with the resistance of the conductor. In large array-type integrated circuits, such as dynamic random access memories (DRAMS), one line, such as the pull up line feeding the sense amplifiers of the DRAM, may be connected to a large number of elements, such as the sense amplifiers. The resistance of a lead is directly proportional to the length of a lead and inversely proportional to the cross sectional area of the lead. In large arrays some leads must be necessarily long. If high speed or appreciable current is required to be carried on these leads a wide cross section (assuming a relatively fixed conductor thickness because of process limitations) must be fabricated, thus occupying valuable space on the integrated circuit.

For example, in a 1 megabit DRAM there are 2,048 sense amplifiers laid out in two rows. A common pull up signal requires a metal lead running to all the rows of sense amplifiers approximately 37μ wide lead running the length of each band of sense amplifiers. In the art of integrated circuit design the space occupied by these leads is enormous and the layout of these leads provides substantial interference with other leads which may be more efficiently laid out.

SUMMARY OF THE INVENTION

The described embodiment of the present invention utilizes the regular nature of a large number of arrays by providing a grid scheme in the array to provide a low impedance point to point interconnection. In the described embodiment of the present invention, a DRAM includes a number of leads running perpendicular to the sense amplifier layout. For a given signal, each lead is interconnected at a bus lead running parallel to the layout of the sense amplifiers. Thus each lead in the parallel array carries a portion of the current. In addition, in this scheme it can be assured that a substantial number of perpendicular leads will be near any particular sense amplifier. Because of the close proximity of the perpendicular conductors the parallel bus lines to the sense amplifiers need not be as wide as feeder lines in the prior art. Because the perpendicular grid leads and the parallel bus leads may be much smaller than the leads in the prior art, they may be more compactly arranged in the array.

DETAILED DESCRIPTION OF THE PREFERRED EMBODIMENTS

Figure 1:
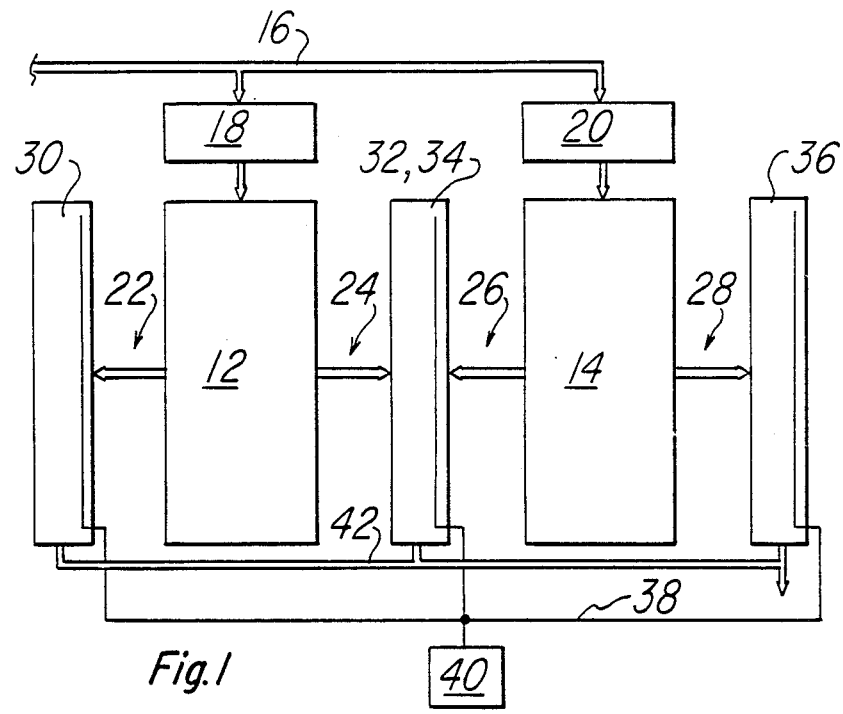
FIG. 1 is a block diagram showing the approximate layout of a two array dynamic random access memory.
Figure 2:
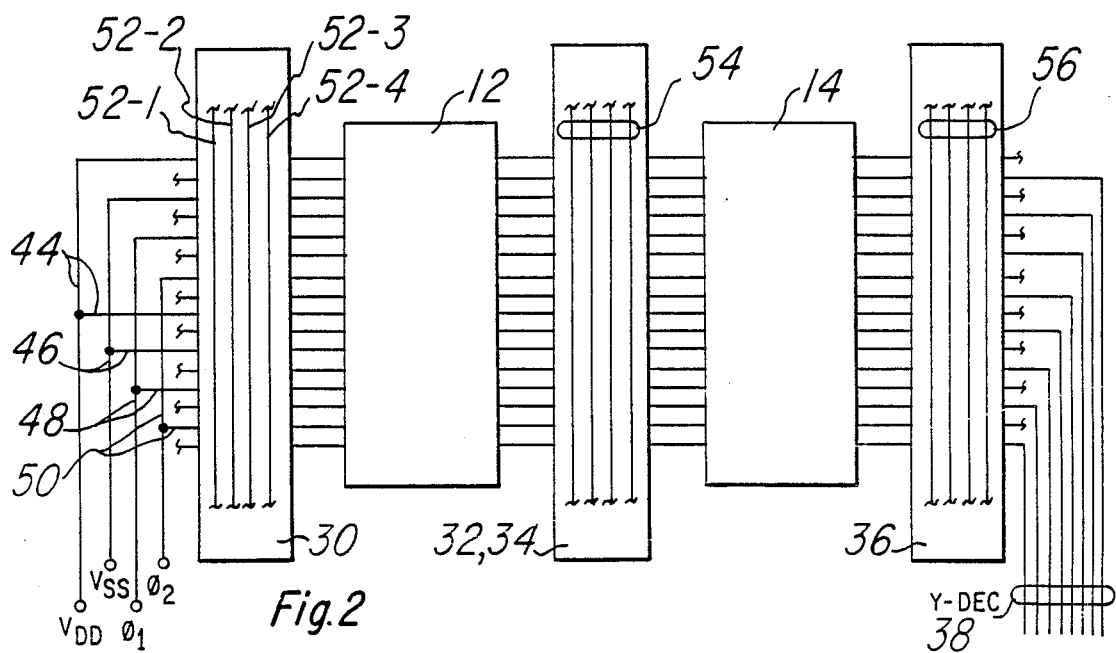
FIG. 2 is a detailed layout showing a portion of the memory of FIG. 1 including the interconnect scheme which is one embodiment of the present invention.

The described embodiments of the present invention are utilized conjunction with a dynamic random access memory. The present invention is not limited to use with a dynamic random access memory, but may advantageously be used in conjunction with other devices having regular or partially irregular arrays such as programmable array logic circuits, programmable logic array circuits or static random access memories. The example of a dynamic random access memory is provided for exemplary purposes only. In the description of the preferred embodiment, FIG. 1 is a block diagram laying out a dynamic random access memory including one embodiment of the present invention. FIG. 2 is a more detailed diagram showing specific aspects of the described embodiment in the array of FIG. 1.

Array 10 of FIG. 1 is a dyanamic random access memory array where memory cell arrays 12 and 14 are selected by address signals provided on address bus 16 which are decoded by decoders 18 and 20. The selected memory cells provide a plurality of data bits on bus lines 22, 24, 26 and 28 to sense amplifier rows 30, 32, 34 and 36, respectively. The data bits provided to the sense amplifiers are partially selected by the Y decode signals provided on bus 38 from Y decode logic generator 40. The data provided from the sense amplifiers in sense amplifer rows 30, 32, 34 and 36 are provided on bus 42 to further decoding circuitry.

The sense amplifiers in sense amplifier rows 30, 32, 34 and 36 are of the type providing phased clocking for high speed accurate operation. An example of this type of amplifier may be provided in McAlexander III et al, U.S. Pat. No. 4,748,349, issued May 31, 1988 and assigned to the assignee of the present application and White, Jr. et al, U.S. Pat. No. 4,081,701, issued Mar. 28, 1978 and assigned to the assignee of the present application.

FIG. 2 is a schematic diagram showing memory arrays 12 and 14 and sense amplifier rows 30 and 36 with rows 32 and 34 combined in the center of the diagram. These sense amplifiers comprise the units driven by the interconnect system of this embodiment. The Y decode signals provided on bus 38 are shown as leads running perpendicular to the layout of the sense amplifier rows. Interleaved within these rows are signals providing positive supply voltage (VDD), on leads (conductor) 44, negative supply voltage (VSS) on leads (condutor) 46, a first phased clocking signal $\phi_1$ on leads (conductor) 48 and a second phased clocking signal $\phi_2$ on leads (conductor) 50. In a memory array such as memory array 10 (FIG. 1), ample room is provided between the Y decode leads 38 (eight shown in FIG. 2) to provide for the multiple leads 44, 46, 48 and 50. In the diagram of FIG. 2, only two leads are shown connected to each of multiple leads 44, 46, 48 and 50. In an actual embodiment many more leads would be provided across the entire width of the memory array. Thus rather than a 37μ wide lead running across the length of the bank of sense amps, the present invention provides plural leads having a width (w) of 3 microns thus comprising substantially the same cross sectional area and thus the low resistance of a 37μ wide bus type lead. Bus leads 52-1 through 52-4, 54-1 through 54-4 and 56-1 through 56-4 run the length of the sense amplifier rows. Each of the parallel leads 44 which is connected to terminal VDD is connected to bus lead 52-1, 54-1 and 56-1. Similarly, each of the parallel leads 46 which is connected to the terminal VSS is connected to bus 52-2, 54-2 and 56-2. Also, each of the parallel leads 48 which is connected to $\phi_1$ is connected to bus leads 52-3, 54-3 and 56-3. And finally, each of the parallel leads 50 which is connected to $\phi_2$ is connected to bus leads 52-4, 54-4 and 56-4. Because of the dispersed nature of the parallel leads, a substantial number of leads will be in close proximity to any selected sense amplifier, thus providing a short signal path to that sense amplifier. Therefore, bus leads 52, 54 and 56 comprise leads approximately 4 $\mu$ wide shown by the symbol (>w) as opposed to the 37$\mu$ wide leads provided in the prior art.

Although specific embodiments of the present invention are herein described, they are not to be construed as limiting the scope of the present invention. The present invention is limited only by the claims appended hereto.

What is claimed is:

1. An electronic array comprising:
   at least one group of electronic devices disposed in a linear manner;
   a plurality of parallel connected electrical conductors disposed perpendicular to the direction of linear disposition of said group of electronic devices, each of said conductors having a predetermined height and a predetermined width dimension, said conductors connected to a common electrical signal source; and
   a bus lead having a height dimension substantially the same as said height dimension of said conductors and a width dimension which is greater than the width dimension of any of said conductors disposed parallel to said direction of linear disposition of said electronic devices, each of said electrical conductors electrically connected to said bus lead.

2. An array as in claim 1 wherein said array is a memory array.

3. An array as in claim 2 wherein said memory array is a dynamic random access memory array.

4. An array as in claim 2 wherein said electronic devices are sense amplifiers.

5. An electronic array comprising:
   at least one group of electronic devices disposed in a linear manner;
   a plurality of sets of parallel connected electrical conductors disposed perpendicular to the direction of linear disposition of said group of electronic devices, each said set of conductors being interleaved with the other of said sets of conductors, each of said conductors having a predetermined height and a predetermined width dimension, each of said conductors in a set being connected to a common electrical signal source; and
   a plurality of bus leads, one of said bus leads connected to one of said sets of conductors, each said bus lead having a height dimension substantially the same as said height dimension of said conductors and a width dimension which is greater than the width dimension of any of said conductors of said set disposed parallel to said linear disposition of said electronic devices.

6. An array as in claim 5 wherein said array is a memory array.

7. An array as in claim 6 wherein said memory array is a dynamic random access memory array.

8. An array as in claim 6 wherein said electronic devices are sense amplifiers.

9. An array comprising:
   a plurality of groups of electronic devices, each of said groups of electronic devices disposed in a linear manner;
   a plurality of parallel electrical conductors disposed perpendicular to the direction of linear disposition of each of said groups of electronic devices, each of said conductors having a predetermined height and a predetermined width dimension, said conductors connected at one or both ends to a common electrical signal source; and
   a plurality of bus leads, one of said bus leads connected to one of said sets of conductors, each said bus lead having a height dimension substantially the same as said height dimension of said conductors and a width dimension which is greater than the width dimension of any of said conductors of said set disposed parallel to said direction of linear disposition of said electronic devices, at least one of said bus leads being proximally disposed to each of said groups of electronic devices, each of said electrical conductors electrically connected to a said bus lead.

10. An array as in claim 9 wherein said array is a memory array.

11. An array as in claim 10 wherein said memory array is a dynamic random access memory array.

12. An array as in claim 10 wherein said electronic devices are sense amplifiers.

* * * * *

UNITED STATES PATENT AND TRADEMARK OFFICE
CERTIFICATE OF CORRECTION

PATENT NO. : 4,975,874

DATED : December 4, 1990

INVENTOR(S) : Jimmie D. Childers, et al

It is certified that error appears in the above-identified patent and that said Letters Patent is hereby corrected as shown below:

The drawing sheet, consisting of Figs. 1 and 2, should be deleted to be replaced with the drawing sheet, consisting of Figs. 1, 2, 2a and 2b, as shown on the attached page.

Column 1, line 68, add the following:

FIG. 2a is a cross sectional view of Figure 2 taken along the section line 2a-2a.
FIG. 2b is a cross sectional view of Figure 2 taken along the section line 2b-2b.

Column 2, line 62, change "(w)" to --(W) (lead 44 shown in FIG. 2a)--.

Column 3, line 12, change "(>w)" to --(>W) (lead 52-1 shown in FIG. 2b)--.

Signed and Sealed this

Twentieth Day of April, 1993

Attest:

MICHAEL K. KIRK

Attesting Officer

Acting Commissioner of Patents and Trademarks

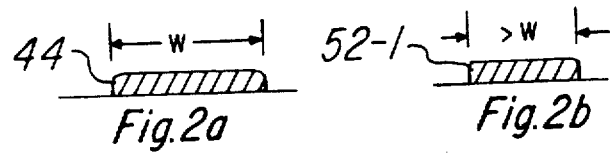
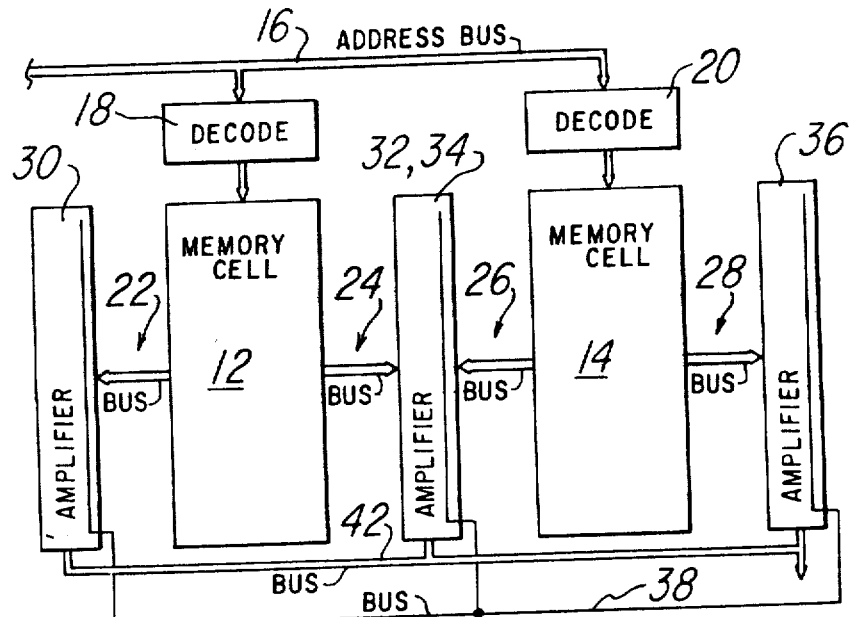
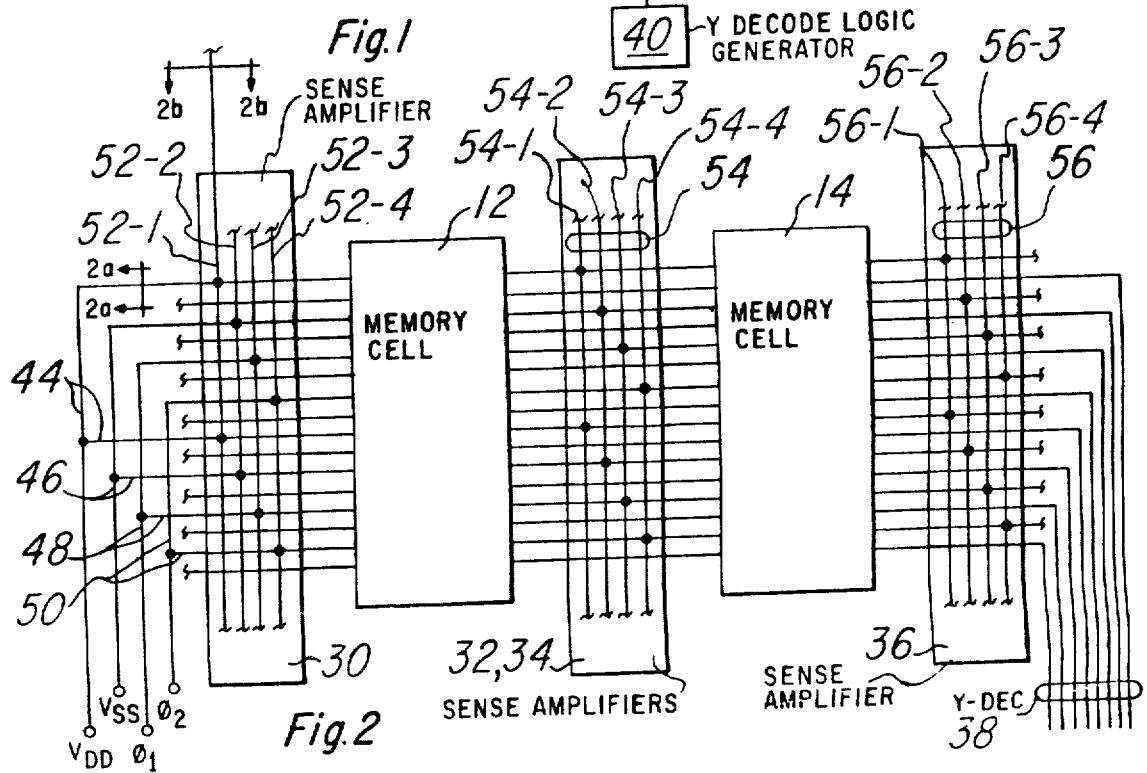

REEXAMINATION CERTIFICATE (3335th)
United States Patent [19]
Childers et al.

[11] B1 4,975,874
[45] Certificate Issued Sep. 23, 1997

[54] METRIX INTERCONNECTION SYSTEM WITH DIFFERENT WIDTH CONDUCTORS

[75] Inventors: Jimmie D. Childers, Missouri City; Hugh P. McAdams, Houston, both of Tex.

[73] Assignee: Texas Instruments Incorporated, Dallas, Tex.

Reexamination Request:
No. 90/004,600, Apr. 9, 1997

Reexamination Certificate for:
Patent No.: 4,975,874
Issued: Dec. 4, 1990
Appl. No.: 265,750
Filed: Nov. 1, 1988

Certificate of Correction issued Apr. 20, 1993.

[51] Int. Cl.$^6$ ............................................. G11C 5/06
[52] U.S. Cl. ..................................... 365/63; 365/51
[58] Field of Search ........................... 365/51, 63, 72, 365/230.03

[56] References Cited
FOREIGN PATENT DOCUMENTS
54-32085  3/1979  Japan ........................ H01L 27/04

*Primary Examiner*—Tan T. Nguyen

[57] ABSTRACT

The described embodiment of the present invention utilizes the regular nature of a large number of arrays by providing a grid scheme in the array to provide a low impedance point to point interconnection. In the described embodiment of the present invention a DRAM includes a number of leads running perpendicular to the sense amplifier layout. For a given signal, each lead is interconnected at a bus lead running parallel to the layout of the sense amplifiers. Thus each lead in the parallel array carries a portion of the current. In addition, in this scheme it can be assured that a substantial number of leads will be near any particular sense amplifier which is drawing on the signal provided on the grid array scheme. Because of the close proximity of the parallel conductors, the bus lines to the sense amplifiers need not be as wide as feeder lines in the prior art. Because the parallel grid leads and the bus leads may be much smaller than the leads in the prior art, they may be more compactly arranged in the array.

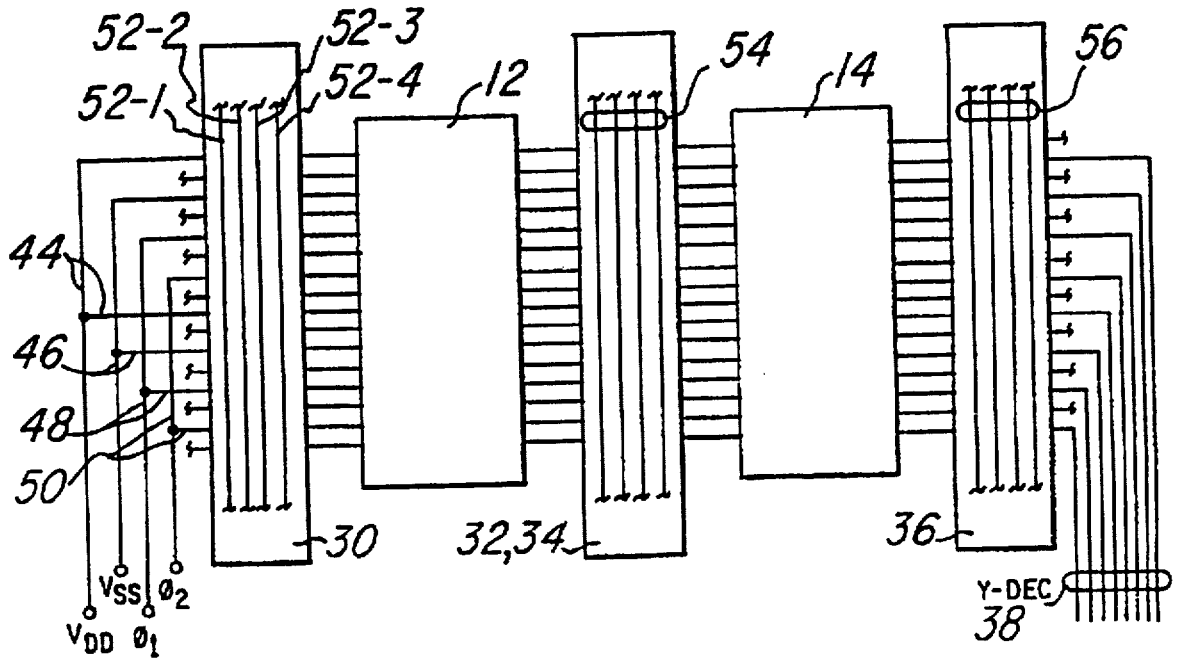

B1 4,975,874

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 5 and 9 are determined to be patentable as amended.

Claims 2–4, 6–8 and 10–12, dependent on an amended claim, are determined to be patentable.

New claims 13–18 are added and determined to be patentable.

1. An electronic array comprising:

[at least] *more than* one group of electronic devices disposed in a linear manner;

a plurality of parallel connected electrical conductors disposed perpendicular to the direction of linear disposition of said group*s* of electronic devices *and extending across more than one of said groups of electronic devices*, each of said conductors having a predetermined height and a predetermined width dimension, said conductors connected to a common electrical signal source; and a *plurality of* bus lead*s* having a height dimension substantially the same as said height dimension of said conductors and a width dimension which is greater than the width dimension of any of said conductors disposed parallel to said direction of linear disposition of said electronic devices, each of said electrical conductors electrically connected to *one of* said bus lead*s*.

5. An electronic array comprising:

[at least] *more than* one group of electronic devices *each* disposed in a linear manner;

a plurality of sets of parallel connected electrical conductors disposed perpendicular to the direction of linear disposition of said group*s* of electronic devices *and extending across more than one of said groups of electronic device*, each said set of conductors being interleaved with the other of said sets of conductors, each of said conductors having a predetermined height and a predetermined width dimension, each of said conductors in a set being connected to a common electrical signal source; and a plurality of bus leads, one of said bus leads connected to one of said sets of conductors, each said bus lead having a height dimension substantially the same as said height dimension of said conductors and a width dimension which is greater than the width dimension of any of said conductors of said set disposed parallel to said linear disposition of said electronic device.

9. An array comprising:

a plurality of groups of electronic devices, each of said groups of electronic devices disposed in a linear manner;

a plurality of parallel connected electrical conductors disposed perpendicular to the direction of linear disposition of each of said groups of electronic devices *and extending across more than one of said groups of electronic devices*, each of said conductors having a predetermined height and a predetermined width dimension, said conductors connected at one or both ends to a common electrical signal source; and a plurality of bus leads, one of said bus leads connected to one of said sets of conductors, each said bus lead having a height dimension substantially the same as said height dimension of said conductors and a width dimension which is greater than the width dimension of any of said conductors of said set disposed parallel to said direction of linear disposition of said electronic devices, at least one of said bus leads being proximally disposed to each of said groups of electronic devices, each of said electrical conductors electrically connected to said bus lead.

*13. An array as in claim 1, wherein said electronic array is a static random access memory.*

*14. An array as in claim 1, wherein said electronic devices are memory cells.*

*15. An array as in claim 5, wherein said electronic array is a static random access memory.*

*16. An array as in claim 5, wherein said electronic devices are memory cells.*

*17. An array as in claim 9, wherein said array is a static random access memory.*

*18. An array as in claim 9, wherein said electronic devices are memory cells.*

* * * * *